US006847721B2

(12) United States Patent
Zhang et al.

(10) Patent No.: US 6,847,721 B2
(45) Date of Patent: Jan. 25, 2005

(54) ACTIVE NOISE CONTROL SYSTEM WITH ON-LINE SECONDARY PATH MODELING

(75) Inventors: Ming Zhang, Singapore (SG); Hui Lan, Singapore (SG); Wee Ser, Singapore (SG)

(73) Assignee: Nanyang Technological University, Singapore (SG)

( * ) Notice: Subject to any disclaimer, the term of this patent is extended or adjusted under 35 U.S.C. 154(b) by 613 days.

(21) Appl. No.: 09/876,758

(22) Filed: Jun. 6, 2001

(65) Prior Publication Data

US 2002/0003887 A1 Jan. 10, 2002

(51) Int. Cl.[7] ................................................ H03B 29/00

(52) U.S. Cl. .................. 381/71.11; 381/71.1; 381/71.5; 381/71.12

(58) Field of Search .............................. 381/71.1, 71.4, 381/71.8, 71.2, 71.3, 71.5, 71.12

(56) References Cited

U.S. PATENT DOCUMENTS 4,677,676 A 6/1987 Eriksson
5,206,911 A 4/1993 Eriksson et al.
5,390,255 A 2/1995 Popovich
5,502,869 A 4/1996 Smith et al.
5,553,153 A 9/1996 Eatwell
5,621,803 A 4/1997 Laak
5,715,320 A * 2/1998 Allie et al. .............. 381/71.12
5,940,519 A 8/1999 Kuo

OTHER PUBLICATIONS

P.A. Nelson & J. S. Elliot, "Active Control of Sound," Academic (New York), (Jun. 5, 1992).

S.M. Kuo & D.R. Morgan, "Active Noise Control Systems—Algorithms and DSP Implementation," Wiley (New York), (Jun. 5, 1996).

* cited by examiner

*Primary Examiner*—Forester W. Isen
*Assistant Examiner*—Corey Chau
(74) *Attorney, Agent, or Firm*—Rutan & Tucker

(57) ABSTRACT

An active noise control system is provided to specify an input transducer, an error transducer, an output transducer and an active noise controller for generating an anti-phase canceling acoustic signal to attenuate an input noise and to output a reduced noise. The active noise control system also performs on-line secondary path modeling. For this purpose the active noise control system comprises, in addition to known systems, a secondary path change detection circuitry (6), a signal distinguishing circuitry (7) and an auxiliary noise control circuitry (8), all of them being used to model said secondary path.

15 Claims, 3 Drawing Sheets

ACTIVE NOISE CONTROL SYSTEM WITH ON-LINE SECONDARY PATH MODELING

BACKGROUND OF THE INVENTION

1. Field of the Invention

The present invention relates to an active noise control system which reduces overall noise level by outputting from an output transducer a canceling signal having a phase opposite to and the same amplitude as that of the noise, more particularly to an active noise control system for on-line secondary path modeling.

The invention arose during continuing development efforts relating to the subject matter shown and described in U.S. Pat. Nos. 4,677,676, 5,206,911, 5,390,255, 5,502,869, 5,553,153, 5,621,803 and 5,940,519, incorporated herein by reference.

2. Background and Summary

Active noise control systems have recently been applied to reduce noise produced by an air conditioner, an engine, a motor and traffics or the like. An active noise control system involves injecting a canceling signal having the same amplitude as that of the noise and a phase opposite to the noise so as to destructively interfere with and thus cancel an input noise. In a known active noise control system an output signal is sensed by an error transducer such as a microphone which supplies an error signal to a control model which in turn supplies a secondary signal to an output transducer such as a loudspeaker which injects a canceling signal to destructively interfere with and cancel an input noise. A digital signal processor (DSP), being a conventional noise controller, uses an adaptive filter of the finite impulse response (FIR) type which forms a signal for canceling noise upon receiving a reference signal from an input transducer such as a microphone, detects said error signal created by said error transducer such as a microphone. Said error signal is called residual noise and it is the result of cancellation. In other words: Said error signal has two functions: on the one hand it serves as a control signal for controlling the whole active noise control system by being fed to said elements described above and by being fed to elements still to be described. With respect to this function it is called “error signal”. On the other hand said error signal is, at the same time, the output signal of the whole active noise control system. With respect to this function it is called “residual noise”. So, whenever in this specification and in the appended claims either the expression “error signal” or the expression “residual noise” are used, they stand for one and the same signal. Said digital signal processor performs a feedback control using a reference signal and said error signal. In this feedback control, furthermore the level of said error signal can be minimized by controlling the filter coefficients of said adaptive filter. Said adaptive filter may use any of a variety of known and available adaptive algorithms, such as the so-called least-mean-square (LMS) algorithm. Detailed descriptions of adaptive algorithms are given in “Adaptive Signal Processing” by B. Widrow and S. D. Stearns, Prentice Hall, (1985).

U.S. Pat. No. 4,677,676 by L. J. Eriksson discloses an active noise control system. This system is a typical example of the prior art. An auxiliary noise source is used to model feedback and secondary paths. The auxiliary noise source is random and uncorrelated to an input noise. The operation of an adaptive filter of an active noise controller affects the on-line path modeling because both the input noise and the canceling signal are the disturbances for the modeling. Furthermore, the auxiliary noise source increases the residual noise in two aspects. Firstly the auxiliary noise contributes to the residual noise through the output transducer. Secondly the auxiliary noise is a perturbation to the operation of the controller adaptive filter, thus the residual noise increases due to degraded performance of the controller.

U.S. Pat No. 5,553,153 by G. P. Eatwell uses a fixed auxiliary signal for on-line secondary path modeling, which requires less computation and reduces coefficient jitter in the adaptive filter. Again, the operation of the active noise controller still affects the on-line path modeling and the auxiliary noise source still increases the residual noise due to addition of the auxiliary noise itself to the residual noise.

U.S. Pat. No. 5,940,519 by S. M. Kuo describes a feed-forward active noise control system which performs on-line feedback path modeling and on-line secondary path modeling. Although the disturbances from both the input noise and the canceling signal for the on-line modeling are reduced, the auxiliary noise source still increases the residual noise in both two aspects as stated above.

SUMMARY OF THE INVENTION

It is an object of the present invention to improve known active noise control systems with on-line secondary path modeling in a way to further reduce said residual noise.

This object is solved by providing a known active noise control system of the on-line secondary path modeling type comprising the features of the independent claim. Further advantageous features are claimed for in dependant claims.

In particular, an active noise control system according to an embodiment of the invention comprises the features of a signal distinguishing circuitry, of a secondary path changing detection circuitry and of an auxiliary noise control circuitry.

The active noise control system according to the present invention operates more efficiently and accurately than known active noise control systems. In contrast to active noise control systems of prior art the active noise control system of the present invention takes advantage of said additional circuitries. The function of each of said additional circuitries is, in short words, described as follows: Said signal distinguishing circuitry greatly reduces interactions between the operation of said active noise controller and said on-line secondary path modeling. These interactions include an influence from the operation of said active noise controller to said on-line secondary path modeling and a perturbation to the operation of said active noise controller due to said auxiliary noise. Said secondary path change detection circuitry detects whether said secondary path has a variation and how big it is and then generates a secondary path change signal to said auxiliary noise control circuitry. Said auxiliary noise control circuitry controls the volume of said auxiliary noise by said secondary path change signal.

Said secondary path change detection circuitry and said auxiliary noise control circuitry operate as follows: At the beginning, said auxiliary noise source allows an auxiliary noise with a quite large amplitude to model said secondary path until said secondary path modeling adaptive filter converges. After said secondary path modeling adaptive filter converges, said two circuitries operate differently in three different cases, i.e.:

1) Said auxiliary noise is turned off when there is no change of said secondary path;
2) Said auxiliary noise is attenuated much when there is a minor change of said secondary path; and
3) Said auxiliary noise is kept unchanged when there is a significant change of said secondary path.

Applying said three circuitries brings about some advantages, such as

1) Said residual noise is reduced further after said secondary path modeling converges; and
2) The system becomes more computational efficient due to no updating of said modeling secondary path adaptive filer and due to no operation of said signal distinguishing circuitry in the case of no change of said secondary path.

DETAILED DESCRIPTION OF A PREFERRED EMBODIMENT OF THE INVENTION

Figure 1:
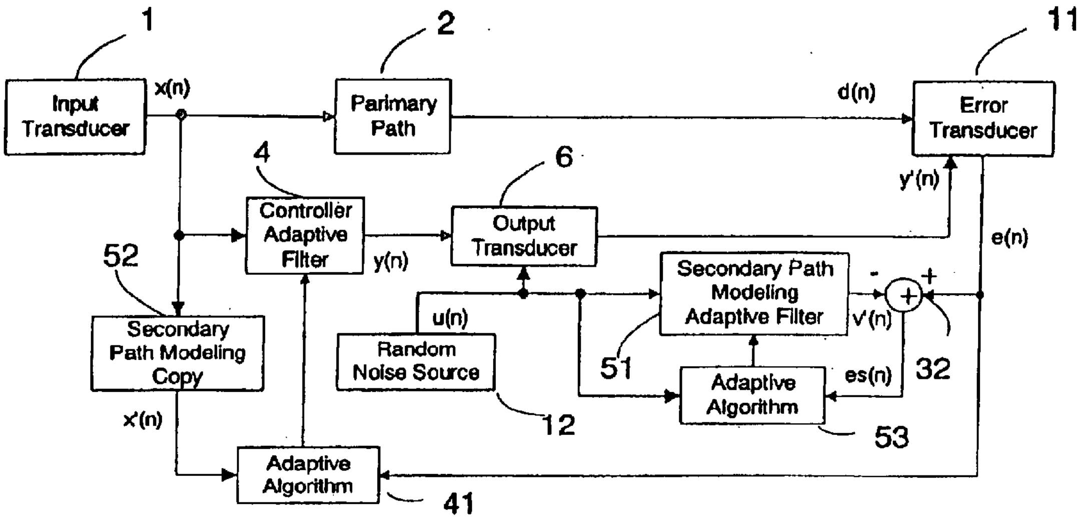
Fig. 1 Prior Art
FIG. 1 illustrates an active noise control system with on-line secondary path modeling known in the prior art.

FIG. 1 shows an active noise control system of the prior art with on-line secondary path modeling. This active noise control system of FIG. 1 has an input transducer 1 for receiving an analog input noise which is converted to a digital input signal x(n) by an A/D converter means. Said analog input noise propagates along a primary path 2 such as a duct or plant to generate an analog primary noise. Said active noise control system introduces an analog canceling signal from an output transducer 6, such as a loudspeaker. Said analog canceling signal is superposed with said analog primary noise at an error transducer 11 to lead to an analog error signal which called the residual noise, outputted by the active noise control system. Said error transducer 11 may comprise a further A/D converter means to convert said analog error signal into a digital error signal e(n) for further processing within the active noise control system. For the sake of convenience, in the following, d(n) and y'(n) are used to represent the digital primary noise and digital canceling signal, respectively, after the AID converter means. Then said error signal e(n)=d(n)−y'(n). A controller adaptive filter 4 receives said input noise x(n) and generates a secondary signal y(n). Said secondary signal y(n) is converted to an analog signal by a D/A converter means and then the analog signal drives said output transducer 6 to generate an analog canceling signal for canceling said analog primary noise. A first adaptive algorithm unit 41 receives a filtered input noise x'(n) and said error signal e(n) and updates said adaptive filter 4 by minimizing the mean square value of said error signal e(n). A secondary path (labeled with the reference symbol "5" in FIG. 2) denotes a path from said secondary signal y(n) via said output transducer 6 to said error signal e(n) from said error transducer 11. A random noise source 12 produces an uncorrelated auxiliary noise u(n) for modeling said secondary path 5. Said uncorrelated auxiliary noise u(n) goes through said output transducer 6 together with said secondary signal y(n). Said uncorrelated auxiliary noise u(n) is the only input to a secondary path modeling adaptive filter 51 and thus ensures that said secondary path modeling adaptive filter 51 will correctly model said secondary path 5. A second adaptive algorithm unit 53 also receives said auxiliary noise u(n) and updates said secondary path modeling adaptive filter 51 by minimizing the mean square value of a modeling error signal es(n). Said secondary path modeling adaptive filter 51 is operable to generate filter taps for performing said minimizing. Said modeling error signal es(n) is an output signal of a first adder 32, which is fed, on the one hand, by said error signal e(n) and, on the other hand, by a modeling output signal v'(n), being outputted by said secondary path modeling adaptive filter 51. The coefficients of said secondary path modeling adaptive filter 51 are copied to a secondary path modeling copy 52 to generate said filtered input noise x'(n) used for performing said filtered least mean square (FxLMS) algorithm.

Figure 2:
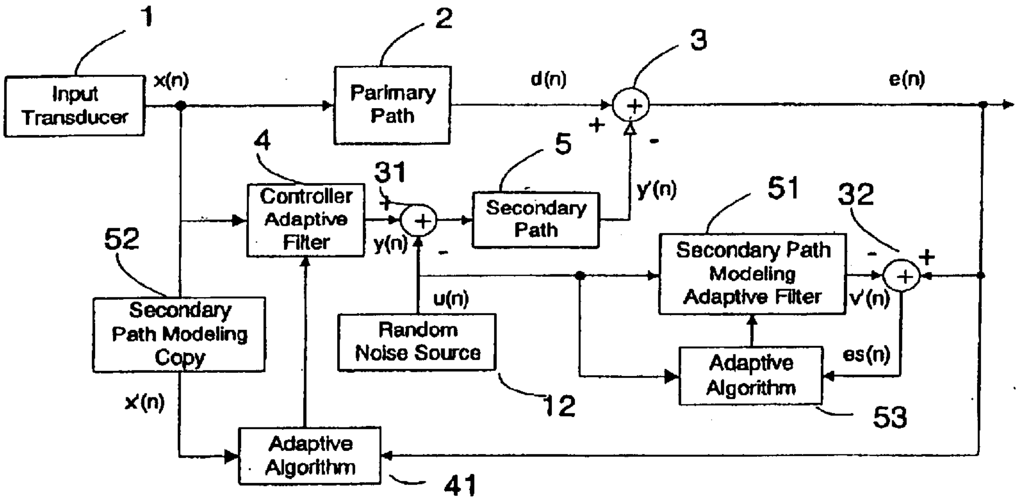
Fig. 2 Prior Art
FIG. 2 illustrates the block diagram structure of the system of FIG. 1.

FIG. 2 shows the block diagram of the active noise control system with on-line secondary path modeling of FIG. 1. Said input transducer 1 is used for receiving and passing said input noise x(n). Said input noise x(n) propagates along said primary path 2 such as a duct or plant to generate said primary noise d(n). Said canceling signal y'(n), generated by said output transducer 6 (in FIG. 2 shown as a second adder 31 and as said secondary path 5, is superposed with said primary noise d(n) at said error transducer 11 (in FIG. 2 shown as a third adder 3) to generate said error signal e(n) at said adder 3. Said controller adaptive filter 4 receives said input noise x(n) and generates said secondary signal y(n) to drive said output transducer 6 (which is said second adder 31 plus said secondary path 5). Said first adaptive algorithm unit 41 receives said filtered input noise x'(n) and said error signal e(n), and updates said adaptive filter 4 by minimizing the mean square value of said error signal e(n). Said random auxiliary noise source 12 produces said uncorrelated auxiliary noise u(n) for modeling said secondary path 5 via said second adder 31. Said uncorrelated auxiliary noise u(n) goes through said secondary path 5 and is (by subtraction) in addition to said secondary signal y(n) at said second adder 31. Said auxiliary noise u(n) is the only input to said secondary path modeling adaptive filter 51 and thus ensures that said secondary path modeling adaptive filter 51 will correctly model said secondary path 5. Said second adaptive algorithm unit 53 receives said uncorrelated auxiliary noise u(n) and said modeling error signal es(n), and updates said secondary path modeling adaptive filter 51 by minimizing the mean square value of said modeling error signal es(n). The coefficients of said secondary path modeling adaptive filter 51 are copied to a secondary path modeling copy 52 to generate said filtered input noise x'(n) for performing said filtered least mean square (FxLMS) algorithm by means of said first adaptive algorithm unit 41.

Figure 3:
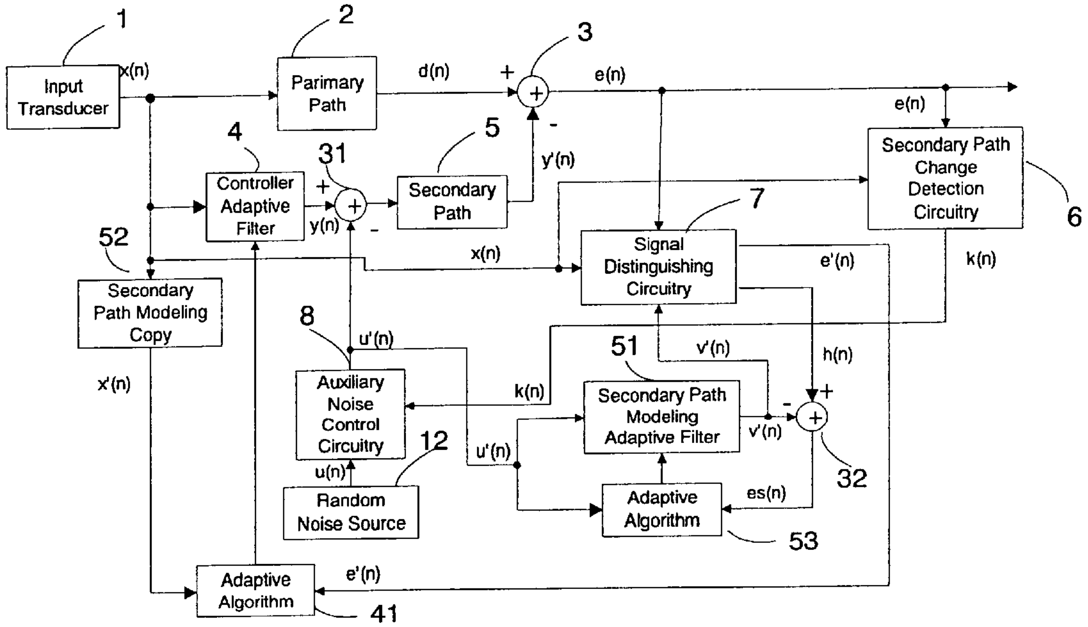
FIG. 3 illustrates the block diagram structure of an active noise control system with on-line secondary path modeling in accordance with the present invention.

FIG. 3 shows an active noise control system with on-line secondary path modeling according to a preferred embodiment of the present invention. In the preferred embodiment of the present invention, three more circuitries are added to the system previously described along FIGS. 1 and 2. These circuitries are a signal distinguishing circuitry 7, a secondary path change detection circuitry 6 and an auxiliary noise control circuitry 8.

The function of said signal distinguishing circuitry 7 is to reduce a disturbance to said secondary path modeling adaptive filter 51 caused by said error signal e(n) and a perturbation to said controller adaptive filter 4 caused by said auxiliary noise u(n). Said signal distinguishing circuitry 7 receives said input noise x(n), said modeling output signal v'(n) from said secondary path modeling filter 51 and said error signal e(n), and generates two output signals, i.e., a modeling desired signal h(n) and a modified error signal e'(n). Said modeling desired signal h(n), being used for said secondary path modeling, should be equivalent to said auxiliary noise u(n) after having passed through said secondary path 5 (in the system according to the prior art as described along FIGS. 1 and 2). Said modified error signal e'(n) for said controller adaptive filter 4 should be equivalent to that component in the error signal e(n) of the system of said prior art, which is only due to said input noise x(n) (not including any signal due to said auxiliary noise u(n)). Said signal distinguishing circuitry 7 is illustrated more fully in FIG. 4 and is described in more detail in subsequent paragraphs.

The function of said secondary path change detection circuitry 6 is to detect whether a change occurs on said secondary path 5 and how big such a change is. Said secondary path change detection circuitry 6 receives said input noise x(n) and said error signal e(n), and outputs said secondary path change signal k(n) to said auxiliary noise control circuitry 8. Said secondary path change signal k(n) can be defined by many values. For example it can be defined by three values, i.e.:

- by the value of said secondary path change signal k(n) being 0, if a detection shows that there is no change of said secondary path 5,
- by the value of said secondary path change signal k(n) being 1, if said detection shows a small change of said secondary path 5, and
- by the value of said secondary path change signal k(n) being 2, if said detection finds out a significant change of said secondary path 5.

Said noise control circuitry 8 controls a volume of said auxiliary noise u(n) according to said values of said secondary path change signal k(n), i.e., $u'(n)=m*u(n)$ where m is a parameter which depends on said values of said secondary path change signal k(n).

The control mechanism is as follows:

1) m=0, if said value of said secondary path change signal k(n)=0;

2) m is a small value ($0<m\ll 1$), if said value of said secondary path change signal if k(n)=1;

and 3) m=1, if said value of said secondary path change signal k(n)=2.

In the preferred embodiment of the present invention, the volume of said auxiliary noise u(n) is large in order to get faster convergence and higher accuracy for said secondary path modeling during the updating of said secondary path modeling adaptive filter 51. After said secondary path modeling adaptive filter 51 converges, said auxiliary noise u(n) may be turned off or attenuated to a much lower volume or kept at the original volume. The purpose is to reduce the residual noise (or: error signal e(n)) due to said auxiliary noise u(n). Said secondary path change detection circuitry 6 and said auxiliary noise control circuitry 8 are illustrated more completely in FIG. 4 and FIG. 5, respectively, and are described in more detail below.

Figure 4:
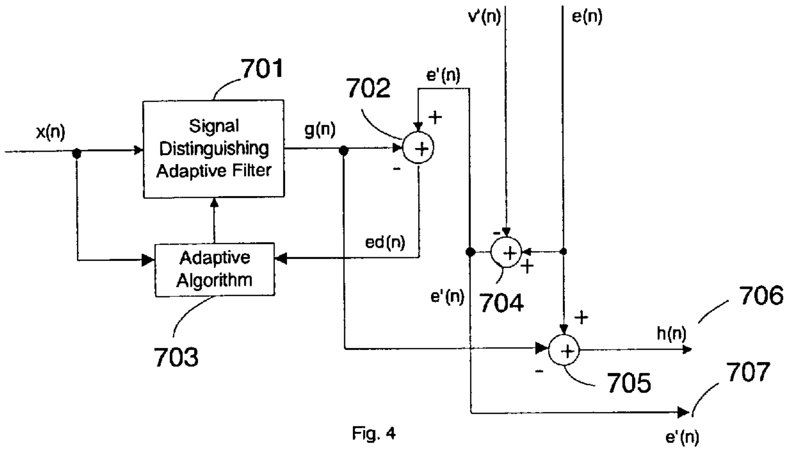
FIG. 4 illustrates a signal distinguishing circuitry which is used in performing on-line secondary path modeling in the present invention.

FIG. 4 illustrates said signal distinguishing circuitry 7. It uses a signal distinguishing adaptive filter 701 excited by said input noise x(n) to generate an output signal g(n), which is fully correlated with said input noise x(n). Two further input signals for said signal distinguishing circuitry 7 are said modeling output signal v'(n) from said secondary path modeling adaptive filter 51 and said error signal e(n). Said modeling output signal v'(n) is subtracted from said error signal e(n) at a fourth adder 704 to generate said modified error signal e'(n) for said first adaptive algorithm 41, and meanwhile said modified error signal e'(n) also subtracts said output signal g(n) at a fifth adder 702 to get a signal ed(n). Said signal ed(n) acts as an error signal for a third adaptive algorithm unit 703. On the other hand, said output signal g(n) of said signal distinguishing adaptive filter 701 is subtracted from said error signal e(n) at a sixth adder 705 to generate said modeling desired signal h(n) to model said secondary path 5.

Figure 5:
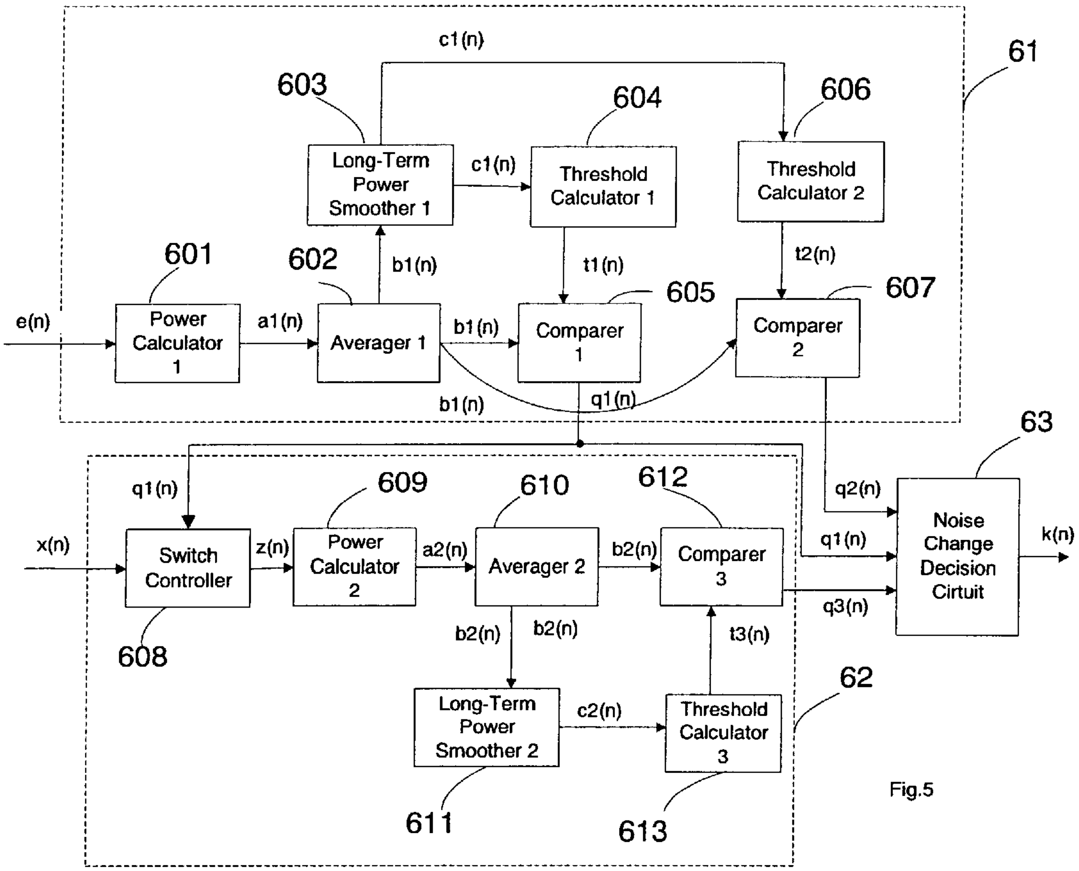
FIG. 5 illustrates a secondary path change detection circuitry which is also used in performing on-line secondary path modeling in the present invention.

FIG. 5 illustrates said secondary path change detection circuitry 6. It includes three circuits, i.e., a residual noise change detection circuit 61, an input noise change detection circuit 62 and a secondary path change decision circuit 63. Said residual noise change detection circuit 61 detects, whether there is a change of the power of said residual noise (or: error signal e(n)) and how big such a change is. Said input noise change detection circuit 62 detects, whether the power of said input noise x(n) changes, when a change occurs to said residual noise (or: error signal e(n)). Said secondary path change decision circuit 63 decides whether the change of the power of said residual noise (or: error signal e(n)) is due to a change of said input noise x(n) or due to a change of said secondary path 5.

The operation of said residual noise change detection circuit 61 is described as follows: Said error signal e(n) is inputted to a first power calculator 601 to generate a first power signal al(n). Said first power signal a1(n) is sent to a first averager 602 to generate a first average power signal b1(n). Said first average power signal b1(n) is sent to a first long-term power smoother 603 to generate a first smoothed power signal c1(n), which is a component for computing a first threshold at a first threshold calculator 604 and a second threshold at a second threshold calculator 606. Besides this, said first average power signal b1(n) is also inputted to a first comparer 605 to generate a first result signal q1(n) and to a second comparer 607 to generate a second result signal q2(n). Said first threshold calculator 604 provides a first, lower threshold signal t1(n) for said first comparer 605 and said second threshold calculator 606 provides a second, higher threshold signal t2(n) for said second comparer 607. So if said first result signal q1(n)=0, i.e., there is no change of said residual noise (or: error signal e(n)), then said second result signal q2(n) is certainly zero. However, if said first result signal q1(n) is not zero, said second result signal q2(n) may be zero or nonzero. Said first result signal q1(n) controls, in said input noise change detection circuit 62, a control switch 608 to control, whether said input noise change detection circuit 62 works or does not work. If said first result signal q1(n) is not zero, i.e., there is a change of said residual noise power (or: error signal e(n)), then said input noise change detection circuit 62 starts to work.

The operation of said input noise change detection circuit 62 is described as follows: Said input noise x(n) is sent (as a working indicator signal z(n)) to a second power calculator 609 through said switch controller 608 to generate a second power signal a2(n), and said second power signal a2(n) is then sent to a second averager 610 to generate a second average power signal b2(n). Said second average power signal b2(n) is sent to a second long-term power smoother 611 to generate a second smoothed power signal c2(n), which is used to compute a third threshold signal t3(n) at a third threshold calculator 613. Said second average power signal b2(n) is also inputted to a third comparer 612 to be compared with said third threshold signal t3(n) from said third threshold calculator 613 to generate a third result signal q3(n). Said first, second and third result signals q1(n), q2(n) and q3(n) are inputted to said secondary path change decision circuit 63.

The operation of said secondary path change decision circuit 63 is described as follows. If said first result signal q1(n)=0, i.e., there is no change of said residual noise (or error signal e(n)), then said secondary path change signal k(n) at the output of said secondary path change decision circuit 63 equals 0 indicating, that no change happened to said secondary path 5. If said first result signal q1(n) is not zero, i.e., there is a change of said residual noise (or: error signal e(n)), then said secondary path change decision circuit 63 checks, whether said second result signal q2(n) and said third result signal q3(n) are zero. If further both of said signals, said second result signal q2(n) and said third result signal q3(n) are zero, said secondary path change signal k(n)=1, which means, that there is a minor change of said secondary path 5. If said second result signal q2(n)=0 but said third result signal q3(n) is not zero, said secondary path change signal k(n)=0, which means, that there is no change of said secondary path 5 (the change of the residual noise (or: error signal e(n)) is due to a change of said input noise x(n)). If said second result signal q2(n) is not zero (whenever said third result signal q3(n) is zero or nonzero), said secondary path change signal k(n)=2, which means, that a significant change happened to said secondary path 5. Said secondary path change signal k(n) is inputted to said auxiliary noise control circuitry 8.

Figure 6:
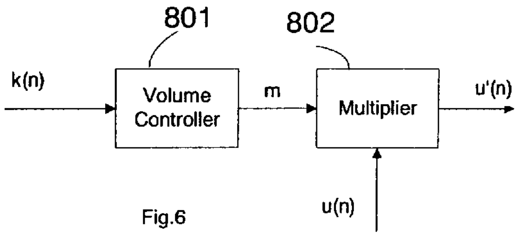
FIG. 6 illustrates an auxiliary noise control circuitry which is still used in performing on-line secondary path modeling in the present invention.

FIG. 6 illustrates said auxiliary noise control circuitry 8. Said auxiliary noise control circuitry 8 receives said secondary path change signal k(n). Said secondary path change signal k(n) is then inputted to a volume controller 801 to generate said parameter m. Said parameter m is multiplied by said auxiliary noise u(n) at a multiplier 802 to output said modified auxiliary noise u'(n). The volume control is described as follows: If said secondary path change signal k(n)=0, said parameter m=0. If said secondary path change signal k(n)=1, said parameter m is a small value ($0<m<<1$). If said secondary path change signal k(n)=2, said parameter m=1. Said modified auxiliary noise u'(n) drives said output transducer 6 (which is shown in the block diagram of FIG. 3 by the elements "second adder 31 and secondary path 5") to model said secondary path 5.

It is apparent that there has been provided, in accordance with the present invention, an active noise control system with on-line secondary path modeling that reduces the adverse effects on overall system operation caused by said secondary path and its modeling and the disturbances to said secondary path modeling due to said primary noise and the operation of said controller adaptive filter. Although the preferred embodiment has been described in detail, it should be understood that various changes, substitutions, and alterations can be made herein without departing from the scope of the present invention. It should also be understood that the present invention may be implemented to reduce any noise source including, but not limited to, vibrations, acoustical signals, electrical signals, and the like.

What is claimed is:

1. An active noise control system with on-line secondary path modeling comprising:

an input transducer (1) operable to output an input noise (x(n)) received;

a primary path (2) and first means (4, 6, 12, 32, 41, 51, 52, 53) for on-line modeling said input noise (x(n)), said first means (4, 6, 12, 32, 41, 51, 52, 53) receiving said input noise (x(n)) and outputting a canceling signal (y'(n));

said primary path (2) outputting a primary noise (d(n)), and an error transducer (11) receiving said primary noise (d(n)) and said canceling signal (y'(n)) and outputting an error signal (e(n));

said error signal (e(n)) being the result of a subtraction of said canceling signal (y'(n)) from said primary noise (d(n)), and said error signal (e(n)) serving as a control signal for controlling said first means (4, 6, 12, 32, 41, 51, 52, 53) for on-line modeling and serving as an output signal of the active noise control system;

wherein said active noise control system further comprises a second means (6, 7, 8) for on-line modeling said first means (4, 6, 12, 32, 41, 51, 52, 53), receiving said input noise (x(n)), said error signal (e(n)) and an auxiliary noise (u(n)) and outputting a modified error signal (e'(n)), a modeling desired signal (h(n)) and a modified auxiliary noise (u'(n)) to said first means (4, 6, 12, 32, 41, 51, 52, 53).

2. The active noise control system of claim 1, wherein said first means (4, 12, 32, 41, 51, 52, 53) comprises a controller adaptive filter (4), an output transducer, a random noise source (12), a secondary path modeling adaptive filter (51) for generating a modeling output signal (v'(n)), a first adder (32) for subtracting said modeling output signal (v'(n)) from said modeling desired signal (h(n)), thereby generating a modeling error signal (es(n)), a first adaptive algorithm unit (41) for receiving a filtered input noise (x'(n)) and updating said controller adaptive filter (4), a second adaptive algorithm unit (53) for receiving said modeling error signal (es(n)) and updating said secondary path modeling adaptive filter (51) and a secondary path modeling copy (52) for receiving said input noise (x(n)) and for providing said filtered input noise (x'(n)) to said first adaptive algorithm unit (41).

3. The active noise control system of claim 2, wherein said output transducer comprises a second adder (31) for subtracting said modified auxiliary noise (u'(n)) from a secondary signal (y(n)), which is provided by said controller adaptive filter (4), thereby generating a sum signal, and a secondary path (5) for receiving said sum signal from said second adder (31).

4. The active noise control system of claim 1, wherein said error transducer (11) comprises a third adder (3) for subtracting said canceling signal (y'(n)) from said primary noise (d(n)).

5. The active noise control system of claim 1, wherein said second means (6, 7, 8) for on-line modeling said first means (4, 6, 12, 32, 41, 51, 52, 53) comprises a secondary path change detection circuitry (6), a signal distinguishing circuitry (7) and an auxiliary noise control circuitry (8).

6. The active noise control system of claim 5, wherein said secondary path change detection circuitry (6) receives said input noise (x(n)) and said error signal (e(n)) for generating a secondary path change signal (k(n)) being outputted, wherein said secondary path change signal (k(n)) describes whether said secondary path has a variation.

7. The active noise control system of claim 6, wherein said auxiliary noise control circuitry (8) receives said auxiliary noise (u(n)) and said secondary path change signal (k(n)) for generating said modified auxiliary noise (u'(n)).

8. The active noise control system of claim 5, wherein said signal distinguishing circuitry (7) receives said input noise (x(n)), said error signal (e(n)) and a modeling output signal (v'(n)) generated by said first means (4, 6, 12, 32, 41, 51, 52, 53), said signal distinguishing circuitry (7) generating said modified error signal (e'(n)) and said modeling desired signal (h(n)).

9. The active noise control system of claim 5, wherein said signal distinguishing circuitry (7) comprises a signal distinguishing adaptive filter (701), a third adaptive algorithm unit (703) and fourth (704), fifth (702) and sixth (705) adders, wherein said distinguishing adaptive filter (701) and said third adaptive algorithm unit (703) receive said input noise (x(n)), wherein said distinguishing adaptive filter (701) outputs an output signal being fed to said fifth adder (702), wherein said fourth (704) and sixth (705) adder receive said error signal (e(n)), wherein said fourth adder (704) outputs said modified error signal (e'(n)), wherein said fifth adder (702) additionally receives said modified error signal (e'(n)) and outputs a signal ed(n), which is fed to said third adaptive algorithm unit (703), and wherein said sixth adder (705) outputs said modeling desired signal (h(n)).

10. The active noise control system of claim 5, wherein said secondary path change detection circuitry (6) comprises a residual noise change detection circuit (61), an input noise change detection circuit (62) and a secondary path change decision circuit (63), wherein said residual noise change detection circuit (61) receives said error signal (e(n)), wherein said input noise change detection circuit (62) receives said input noise (x(n)) and wherein said secondary path change decision circuit (63) outputs said secondary path change signal (k(n)).

11. The active noise control system of claim 10, wherein said residual noise change detection circuit (61) comprises a first power calculator (601), a first averager (602), a first long-term power smoother (603), a first (604) and a second (606) threshold calculator and a first (605) and a second (607) comparer, wherein said first power calculator (601) receives said error signal (e(n)) and outputs a first power signal (a1(n)), wherein said first averager (602) receives said first power signal (al(n)) and outputs a first average power signal (b1(n)) to said first long-term power smoother (603) and to said first comparer (605), wherein said first long-term power smoother (603) outputs a first smoothed power signal (c1(n)) to said first (604) and second (606) threshold calculators, wherein said first (604) and second (606) threshold calculators output a first, lower threshold signal (t1(n)) and, respectively a second, higher threshold signal (t2(n)) signal to said first (605) and second (607) comparer, respectively, wherein said first (605) and second (607) comparers output a first (q1(n)) and, respectively, a second (q2(n)) result signal.

12. The active noise control system of claim 10, wherein said input noise change detection circuit (62) comprises a switch controller (608), a second power calculator (609), a second averager (610), a second long-term power smoother (611), a third threshold calculator (613) and a third comparer (612), wherein said switch controller (608) receives said input noise (x(n)) and said first result signal (q1(n)) and outputs a working indicator signal (z(n)) to said second power calculator (609), which in turn outputs a second power signal (a2(n)) to said second averager (610), wherein said second averager (610) outputs a second average power signal (b2(n)) to said second long-term power smoother (611) and to said third comparer (612), wherein said second long-term power smoother (611) outputs a second smoothed power signal (c2(n)) to said third threshold calculator (613), wherein said third threshold calculator (613) outputs a third threshold signal (t3(n)) signal to said third comparer (612), wherein said third comparer (612) outputs a third result signal (q3(n)).

13. The active noise control system of claim 10, wherein said secondary path change decision circuit (63) receives said first (q1(n)), said second (q2(n)) and said third result signal (q3(n)) and outputs said secondary path change signal (k(n)).

14. The active noise control system of any of the claims 5 to 13, wherein said auxiliary noise control circuitry (8) comprises a volume controller (801) and a multiplier (802), wherein said volume controller (801) receives said secondary path change signal (k(n)) and generates a parameter (m), which is outputted to said multiplier (802), wherein said multiplier (802) receives said parameter (m) and said auxiliary noise (u(n)) and generates said modified auxiliary noise (u'(n)) from said auxiliary noise (u(n)) dependent on said parameter (m), which modified auxiliary noise (u'(n)) then, in turn, is outputted.

15. The active noise control system of claim 2, wherein said first adaptive algorithm unit (41) updates said adaptive filter (4) by minimizing the mean square value of said modified error signal (e'(n)).

* * * * *